United States Patent
Hara et al.

(10) Patent No.: US 9,779,913 B2
(45) Date of Patent: Oct. 3, 2017

(54) CHARGED PARTICLE BEAM DRAWING APPARATUS AND DRAWING DATA GENERATION METHOD

(71) Applicant: NuFlare Technology, Inc., Yokohama-shi (JP)

(72) Inventors: Shigehiro Hara, Kawasaki (KR); Kenichi Yasui, Kawasaki (JP); Hiroshi Yamashita, Sagamihara (JP); Yasuo Kato, Yokohama (JP); Saori Gomi, Zushi (JP); Shinji Sakamoto, Yokohama (JP); Takao Tamura, Machida (JP); Hideo Tsuchiya, Setagaya-ku (JP); Noriaki Nakayamada, Kamakura (JP); Hironobu Matsumoto, Yokohama (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 15/056,300

(22) Filed: Feb. 29, 2016

(65) Prior Publication Data

US 2016/0284510 A1     Sep. 29, 2016

(30) Foreign Application Priority Data

Mar. 25, 2015 (JP) .................. 2015-062960

(51) Int. Cl.
*H01J 37/304* (2006.01)
*H01J 37/20* (2006.01)
(Continued)

(52) U.S. Cl.
CPC ...... *H01J 37/3026* (2013.01); *H01J 37/3174* (2013.01); *H01J 2237/31762* (2013.01); *H01J 2237/31776* (2013.01)

(58) Field of Classification Search
CPC .. H01J 37/3174; H01J 37/3026; H01J 37/304; H01J 37/04; H01J 37/185;
(Continued)

(56) References Cited

U.S. PATENT DOCUMENTS 5,760,410 A * 6/1998 Matsuki ................. B82Y 10/00
                                                    250/398
5,847,959 A * 12/1998 Veneklasen ............ B82Y 10/00
                                                    250/492.2
(Continued)

FOREIGN PATENT DOCUMENTS

CN      102466984 A      5/2012
JP      11-204415        7/1999
(Continued)

OTHER PUBLICATIONS

Office Action dated Nov. 9, 2016 in Korean Patent Application No. 10-2016-0033888.
(Continued)

*Primary Examiner* — David A Vanore
(74) *Attorney, Agent, or Firm* — Oblon, McClelland, Maier & Neustadt, L.L.P.

(57) ABSTRACT

In one embodiment, a charged particle beam drawing apparatus includes a drawing unit that draws a pattern in a drawing area on a substrate and a control processing circuitry that controls the drawing unit via a process including receiving drawing data with a hierarchical correction map input to the control processing circuitry. The drawing data with the hierarchical map includes a plurality of files in which division maps are respectively described in files in units of subframes. Each division map includes dose correction information associated with corresponding one of blocks of the drawing area. The process further includes generating shot data by performing a data conversion process on the drawing data, reading a division map corre-
(Continued)

sponding to a block in the area to be drawn from the hierarchical correction map, calculating a dose, and controlling the drawing unit based on the shot data and the calculated dose.

18 Claims, 16 Drawing Sheets

(51) Int. Cl.
*H01J 37/302* (2006.01)
*H01J 37/317* (2006.01)

(58) Field of Classification Search
CPC ........ H01J 37/20; H01J 37/21; H01J 37/3023; H01J 37/3045; H01J 37/305; B82Y 10/00; B82Y 40/00
USPC ...... 250/492.22, 396 R, 491.1, 492.3, 492.2, 250/492.23, 398; 430/30, 296, 5, 942, 430/311, 313, 322
See application file for complete search history.

(56) References Cited

U.S. PATENT DOCUMENTS

| | | | | | |
|---|---|---|---|---|---|
| 5,892,237 | A | * | 4/1999 | Kawakami | B82Y 10/00 250/491.1 |
| 6,110,627 | A | * | 8/2000 | Nakasuji | B82Y 10/00 430/296 |
| 6,373,071 | B1 | * | 4/2002 | Innes | B82Y 10/00 250/492.22 |
| 6,379,851 | B1 | * | 4/2002 | Innes | B82Y 10/00 430/296 |
| 6,420,717 | B1 | * | 7/2002 | Babin | B82Y 10/00 250/492.2 |
| 6,424,879 | B1 | * | 7/2002 | Chilese | B82Y 10/00 250/491.1 |
| 7,498,591 | B2 | * | 3/2009 | Lozes | B82Y 10/00 250/491.1 |
| 9,218,942 | B2 | * | 12/2015 | Matsumoto | B82Y 10/00 |
| 9,224,578 | B2 | * | 12/2015 | Nakayamada | H01J 37/3174 |
| 2002/0148978 | A1 | * | 10/2002 | Innes | B82Y 10/00 250/492.22 |
| 2005/0053850 | A1 | * | 3/2005 | Askebjer | G03F 7/70558 430/5 |
| 2005/0084766 | A1 | * | 4/2005 | Sandstrom | G03F 7/70283 430/5 |
| 2007/0023703 | A1 | * | 2/2007 | Sunaoshi | B82Y 10/00 250/492.22 |
| 2009/0001293 | A1 | * | 1/2009 | Sunaoshi | B82Y 10/00 250/492.22 |
| 2009/0175143 | A1 | * | 7/2009 | Kasono | B82Y 10/00 369/47.15 |
| 2009/0230316 | A1 | * | 9/2009 | Goto | B82Y 10/00 250/396 R |
| 2010/0072390 | A1 | * | 3/2010 | Yashima | B82Y 10/00 250/396 R |
| 2010/0183963 | A1 | * | 7/2010 | Zable | B82Y 10/00 430/30 |
| 2011/0057114 | A1 | * | 3/2011 | Yamada | B82Y 10/00 250/396 R |
| 2011/0165502 | A1 | * | 7/2011 | Caldwell | G03F 1/68 430/5 |
| 2012/0068089 | A1 | * | 3/2012 | Nakayamada | B82Y 10/00 250/492.22 |
| 2012/0126145 | A1 | * | 5/2012 | Yashima | B82Y 10/00 250/492.3 |
| 2013/0105108 | A1 | * | 5/2013 | Zywno | H01J 37/20 165/11.1 |
| 2013/0316288 | A1 | * | 11/2013 | Nakayamada | G03F 7/2061 430/296 |
| 2016/0284510 | A1 | * | 9/2016 | Hara | H01J 37/3026 |

FOREIGN PATENT DOCUMENTS

| | | |
|---|---|---|
| JP | 2003-43661 | 2/2003 |
| JP | 2003-77790 | 3/2003 |
| JP | 2007-150243 | 6/2007 |
| JP | 2007-220728 | 8/2007 |
| JP | 2007-258659 | 10/2007 |
| JP | 2009-33025 | 2/2009 |
| JP | 4989158 | 8/2012 |
| KR | 10-2011-0056243 A | 5/2011 |
| TW | 200845087 A | 11/2008 |
| TW | 200931476 A | 7/2009 |
| TW | 201250394 A1 | 12/2012 |
| TW | 201506531 A | 2/2015 |

OTHER PUBLICATIONS

Takashi Kamikubo et al. "Mask Process Correction (MPC) modeling and its application to EUV mask for Electron beam mask writer, EBM-7000" Proc. of SPIE vol. 7823, Sep. 2010, 10 Pages.

Combined Office Action and Search Report dated Feb. 22, 2017 in Taiwanese Patent Application No. 105106515 (with English translation of categories of cited documents).

* cited by examiner

FIG.2
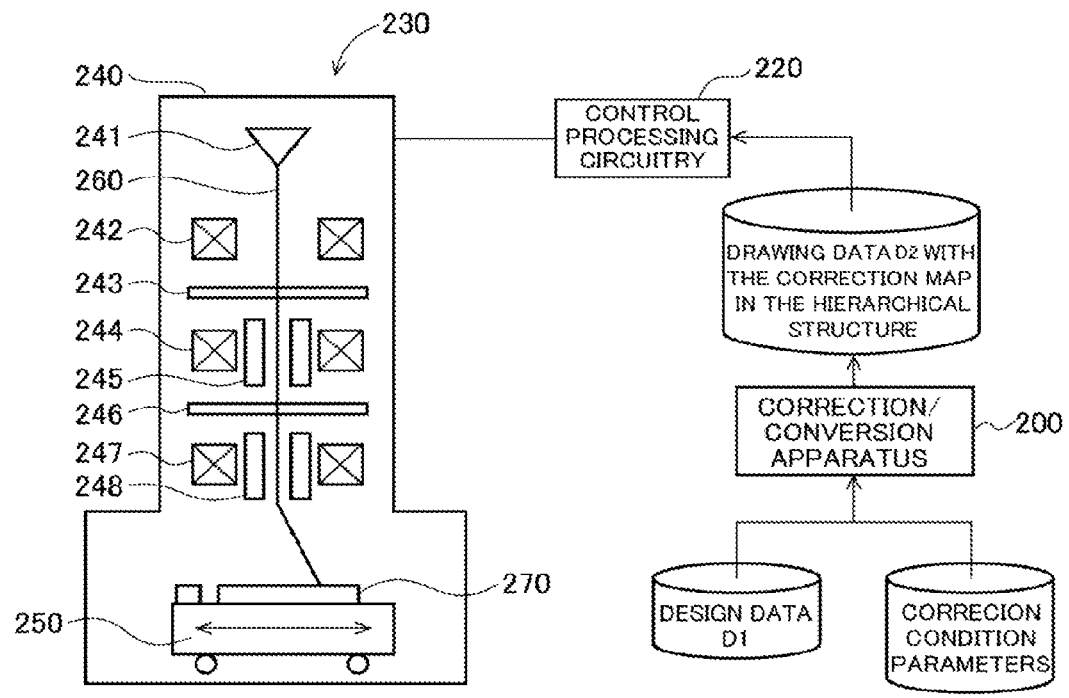
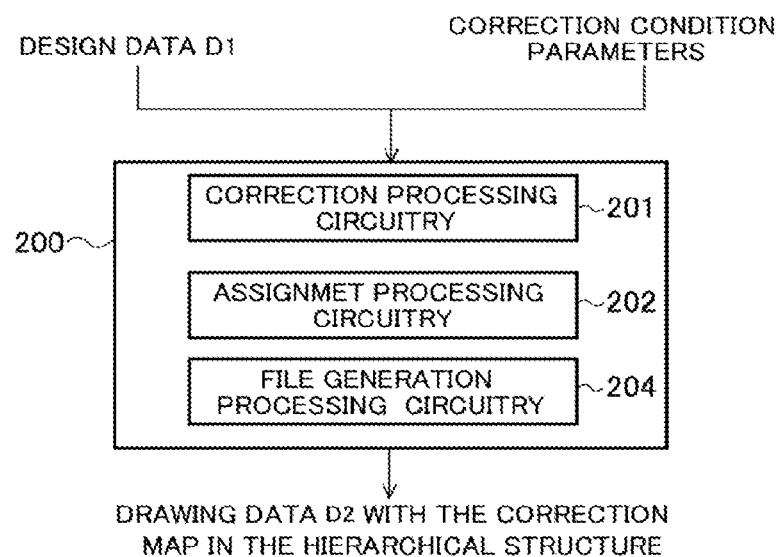
FIG.3

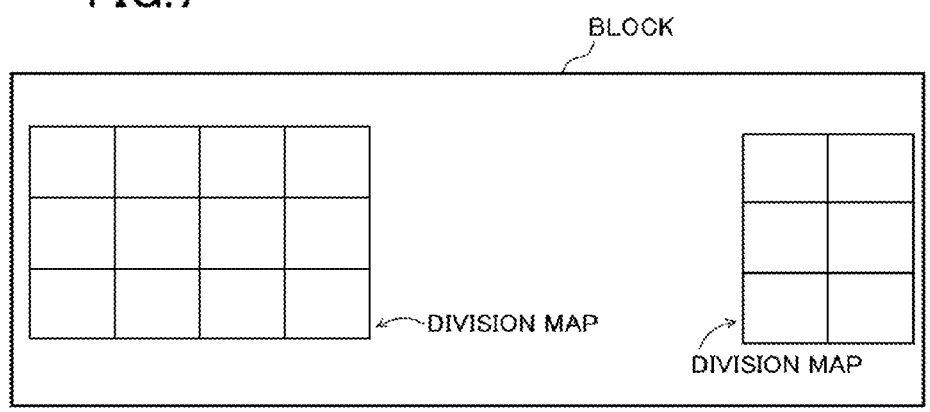
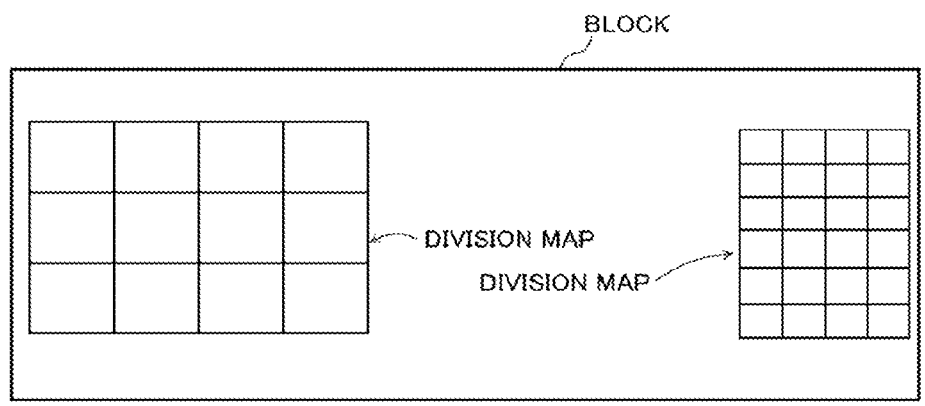

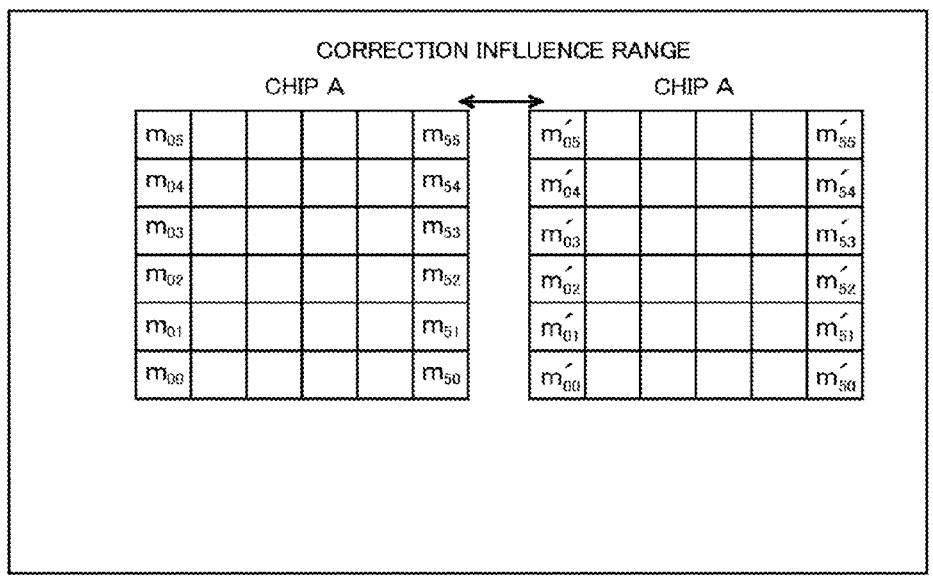
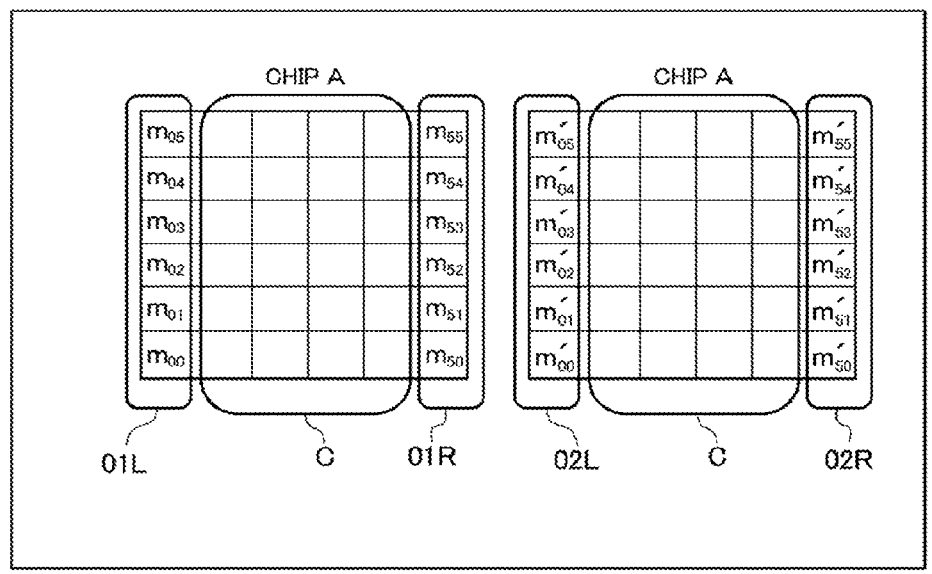

FIG. 16
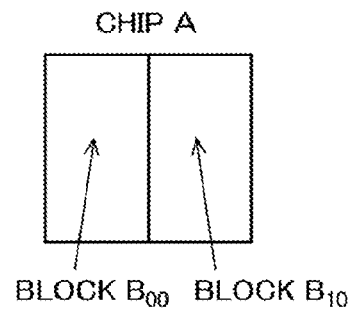
FIG. 17
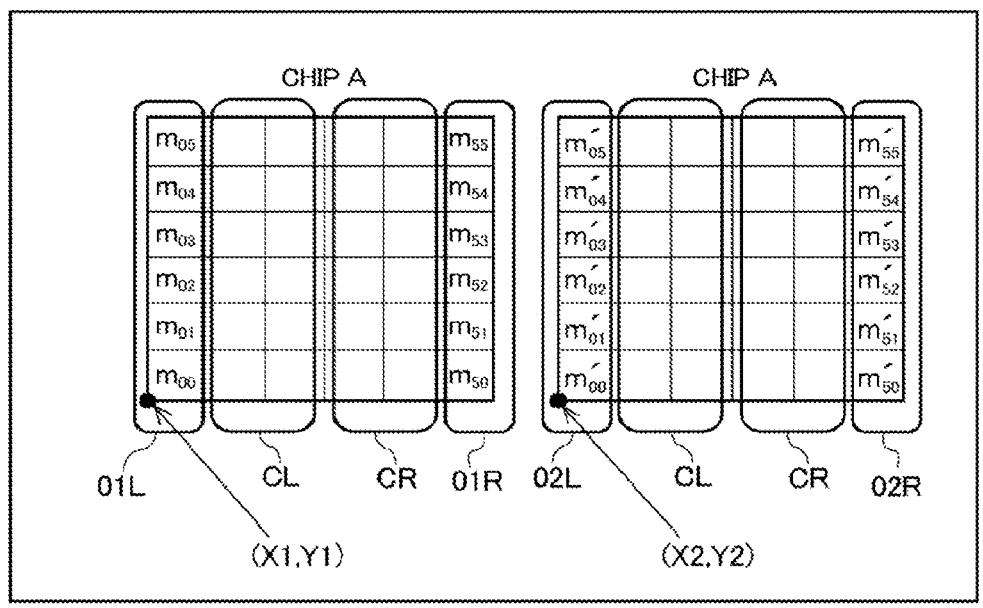
FIG. 18A
MAP DEFINED FOR BLOCK $B_{00}$
| MAP NAME | LINK CODE |
|---|---|
| CL | 0 (ALWAYS REFER) |
| 01L | 1 |
| 02L | 2 |
MAP DEFINED FOR BLOCK $B_{10}$
| MAP NAME | LINK CODE |
|---|---|
| CR | 0 (ALWAYS REFER) |
| 01R | 1 |
| 02R | 2 |

FIG.18B
put X1 Y1 $chipA(1)   APPLY CL, 01L, CR, 01R
put X2 Y2 $chipA(2)   APPLY CL, 02L, CR, 02R
              └JOB DECK LINK CODE
FIG.19
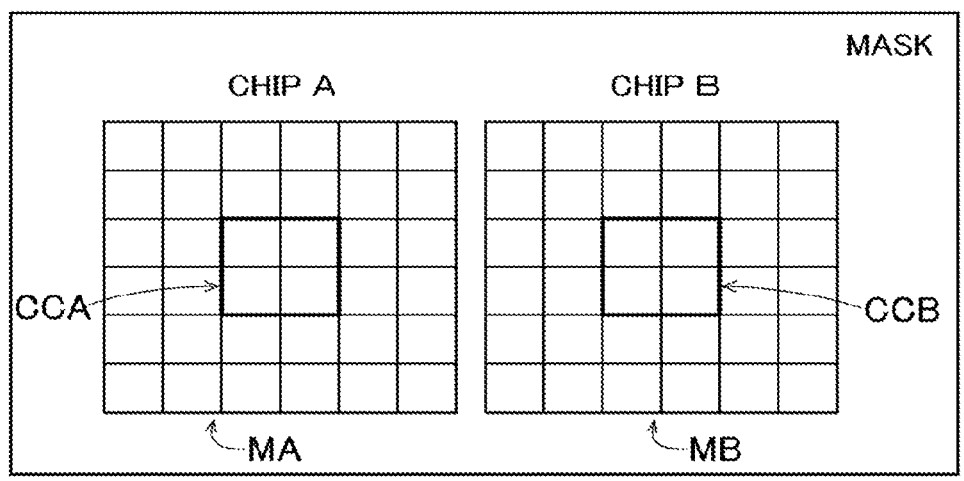
FIG.20
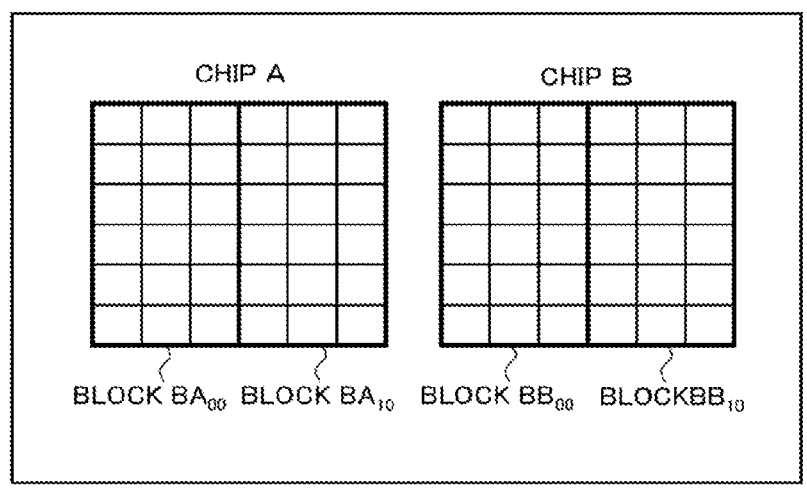

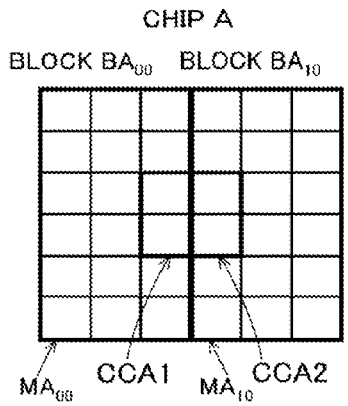

| | DEFINED MAP | COMMENT |
|---|---|---|
| BLOCK $BA_{00}$ | $MA_{00}$ | CORRECTION VALUE WITH CORRECTION CODE =1 IN CCA1<br>CORRECTION VALUE WITH CORRECTION CODE = 0 IN EXCEPT CCA1 |
| | CCA1 | FORMAT IS DIVISION MAP FORMAT. MAP TYPE IS CORRECTION CODE APPLICATION AREA. |
| BLOCK $BA_{10}$ | $MA_{10}$ | CORRECTION VALUE WITH CORRECTION CODE =1 IN CCA2<br>CORRECTION VALUE WITH CORRECTION CODE = 0 IN EXCEPT CCA2 |
| | CCA2 | FORMAT IS DIVISION MAP FORMAT. MAP TYPE IS CORRECTION CODE APPLICATION AREA. |

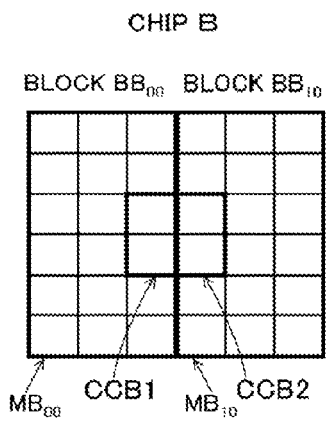

|  | DEFINED MAP | COMMENT |
|---|---|---|
| BLOCK $BB_{00}$ | $MB_{00}$ | CORRECTION VALUE WITH CORRECTION CODE = 1 IN CCB1<br>CORRECTION VALUE WITH CORRECTION CODE = 0 IN EXCEPT CCB1 |
|  | CCB1 | FORMAT IS DIVISION MAP FORMAT, MAP TYPE IS CORRECTION CODE APPLICATION AREA. |
| BLOCK $BB_{10}$ | $MB_{10}$ | CORRECTION VALUE WITH CORRECTION CODE = 1 IN CCB2<br>CORRECTION VALUE WITH CORRECTION CODE = 0 IN EXCEPT CCB2 |
|  | CCB2 | FORMAT IS DIVISION MAP FORMAT, MAP TYPE IS CORRECTION CODE APPLICATION AREA. |

US 9,779,913 B2

CHARGED PARTICLE BEAM DRAWING APPARATUS AND DRAWING DATA GENERATION METHOD

CROSS REFERENCE TO RELATED APPLICATION

This application is based upon and claims benefit of priority from the Japanese Patent Application No. 2015-62960, filed on Mar. 25, 2015, the entire contents of which are incorporated herein by reference.

FIELD

The present invention relates to a charged particle beam drawing apparatus and a drawing data generation method.

BACKGROUND

With increasing integration density of LSIs, a reduction has been achieved every year in terms of the circuit line width of semiconductor devices. To form a desired circuit pattern on a semiconductor device, it is known to employ a method of transferring an original pattern formed on quarts (called a mask or a reticle when used with a stepper or a scanner, a reticle used) to a wafer using a reduction projection exposure apparatus. A high-precision original pattern is drawn using an electron beam drawing apparatus and a so-called electron beam lithography technique.

In electron beam drawing, first, a layout of a semiconductor integrated circuit is designed and layout data (design data) is generated. Thereafter, the layout data is converted to drawing data and input to an electron beam drawing apparatus. The electron beam drawing apparatus performs drawing according to the drawing data.

In the electron beam drawing, there are various phenomena that cause a dimensional change. For example, a proximity effect has an influence radius of about 10 µm, while a fogging effect or a loading effect has an influence radius of a few millimeters. In the inside of the drawing apparatus, to suppress a dimensional change due to an influence of the above, a dose correction calculation is performed in realtime.

A known example of a phenomenon that may cause a dimensional change is a proximity effect peculiar to an EUV mask having an extremely small influence radius of 300 nm to 400 nm. In a case where the dose correction calculation is performed taking into account this influence, a drawing area is divided into a mesh of about 50 nm to 100 nm, and the calculation is performed for each divided small area, which needs a huge amount of processing time for a correction calculation. It is difficult to perform such a calculation in realtime internally in the drawing apparatus, and thus it is desirable to externally calculate an amount of correction in advance and input resultant generated correction information to the drawing apparatus.

However, correction information in a map format has a large data size, which makes it difficult to efficiently transfer data. Furthermore, correction information formed in one data file is not suitable for being subjected to parallel distributed processing, which makes it difficult to efficiently perform data processing.

BRIEF DESCRIPTION OF DRAWING

FIG. 2 is a schematic diagram of an electron beam drawing system according to the first embodiment.

FIG. 3 is a block diagram of a correction/conversion apparatus according to the first embodiment.

FIG. 7 is a diagram illustrating an example in which two division maps are included in one block.

FIG. 8 is a diagram illustrating an example in which a plurality of division maps having different mesh sizes are included in one block.

FIG. 14 is a diagram illustrating a state in which correction maps corresponding to an identical chip are located adjacent to each other.

FIG. 15 is a diagram illustrating an example of a manner of dividing correction maps.

FIG. 16 is a diagram illustrating an example in which a chip is divided into two blocks.

FIG. 17 is a diagram illustrating an example of a manner of dividing correction maps depending on blocks.

FIGS. 18A and 18B are diagrams illustrating a hierarchical correction map according to a second embodiment.

FIG. 19 is a diagram illustrating correction maps for two adjacent chips.

FIG. 20 is a diagram illustrating an example in which one chip is divided into two blocks.

FIGS. 23A and 23B are diagrams illustrating a hierarchical correction map according to a third embodiment.

FIGS. 24A and 24B are diagrams illustrating a hierarchical correction map according to the third embodiment.

DETAILED DESCRIPTION

Figure 1:
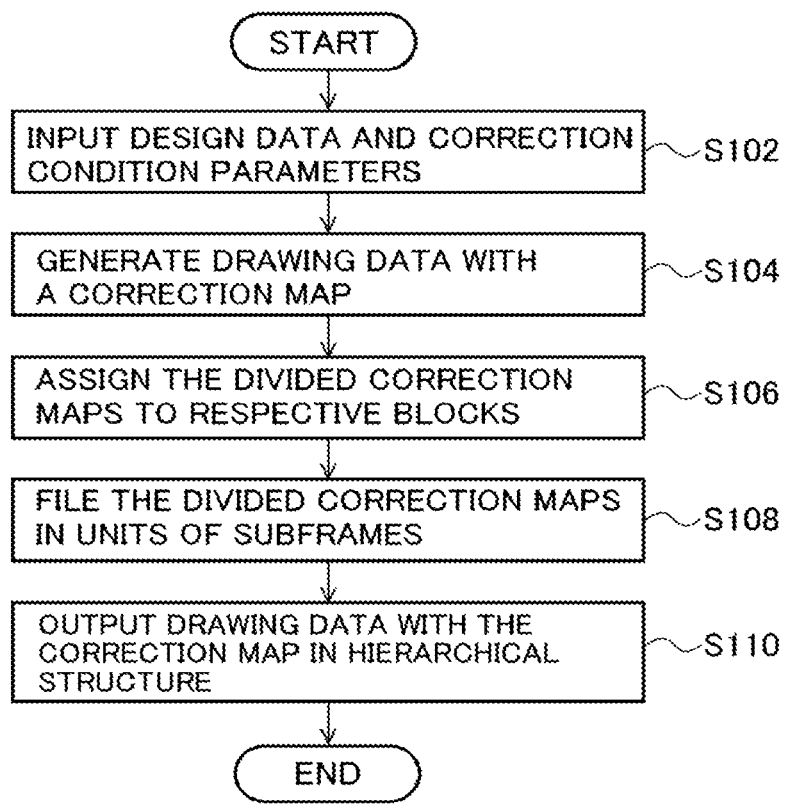
FIG. 1 is a flow chart illustrating a data conversion method according to a first embodiment.

In one embodiment, a charged particle beam drawing apparatus includes a drawing unit that draws a pattern in a drawing area on a substrate and a control processing circuitry that controls the drawing unit via a process including receiving drawing data with a hierarchical correction map input to the control processing circuitry, the drawing data with the hierarchical map including a plurality of files in which division maps are respectively described in files in units of subframes, each division map including dose information associated with corresponding one of blocks of the drawing area, and the process further including generating shot data by performing a data conversion process on the drawing data, reading a division map corresponding to a block in the area to be drawn from the hierarchical correction map, calculating a dose, and controlling the drawing unit based on the shot data and the calculated dose.

Embodiments of the present invention are described below with reference to drawings.

[First Embodiment]

FIG. 1 is a flow chart illustrating a data conversion method in which dose information, described in drawing data, for suppressing a pattern size change caused by a phenomenon with a small influence radius is converted into data in a hierarchical format and is output. As illustrated in FIG. 1, this method includes a step of inputting design data D1 and correction condition parameters (step S102), a step of generating drawing data with dose information (a correction map) described in one file (step S104), a step of dividing the correction map and assigning the divided correction maps to respective blocks (step S106), a step of filing the divided correction maps (division maps) in units of subframes (step S108), and a step of outputting drawing data with the correction map in the hierarchical structure (step S110).

FIG. 2 is a schematic diagram of an electron beam drawing system. As shown in FIG. 2, the electron beam drawing system includes a correction/conversion apparatus 200 and a drawing apparatus including a control processing circuitry 220 and a drawing unit 230.

The drawing unit 230 includes an electron lens column 240, a XY stage 250, an electron gun 241, an illumination lens 242, a first aperture 243, a projection lens 244, a deflector 245, a second aperture 246, an objective lens 247, and a deflector 248.

The correction/conversion apparatus 200 generates drawing data D2 with the hierarchical correction map using the design data D1 and the correction condition parameter. The design data D1 is layout data based on a layout of a semiconductor integrated circuit, and drawing data is generated by converting this design data D1 so as to be capable of being input to the drawing apparatus. The correction map is set based on the correction condition parameter and is described in one file. The hierarchical correction map is generated by dividing the correction map so as to have a hierarchical structure.

The control processing circuitry 220 performs a multistage data conversion process on the drawing data so as to generate apparatus-specific shot data. Using the hierarchical correction map, the control processing circuitry 220 calculates a dose for each mesh area with a predetermined size. The control processing circuitry 220 controls the drawing unit 230 based on the shot data and the calculated dose so as to draw a desired graphic pattern on a mask substrate 270 given as a drawing target.

An electron beam 260 is output from the electron gun 241, and the whole first aperture 243 having a rectangular hole is illuminated with the electron beam 260 via the illumination lens 242. Herein the electron beam 260 is first shaped into a rectangle. After passing through the first aperture 243, the electron beam 260 with a first aperture image is projected via the projection lens 244 onto the second aperture 246. The location of the first aperture image on the second aperture 246 is controlled by the deflector 245 thereby controlling the shape and the dimension of the beam. After passing through the second aperture 246, the electron beam 260 with a second aperture image is subjected to a focus adjustment performed by the objective lens 247, deflected by the deflector 248, and directed onto a desired point on a mask substrate 270 placed on a movable XY stage 250.

Figure 4:
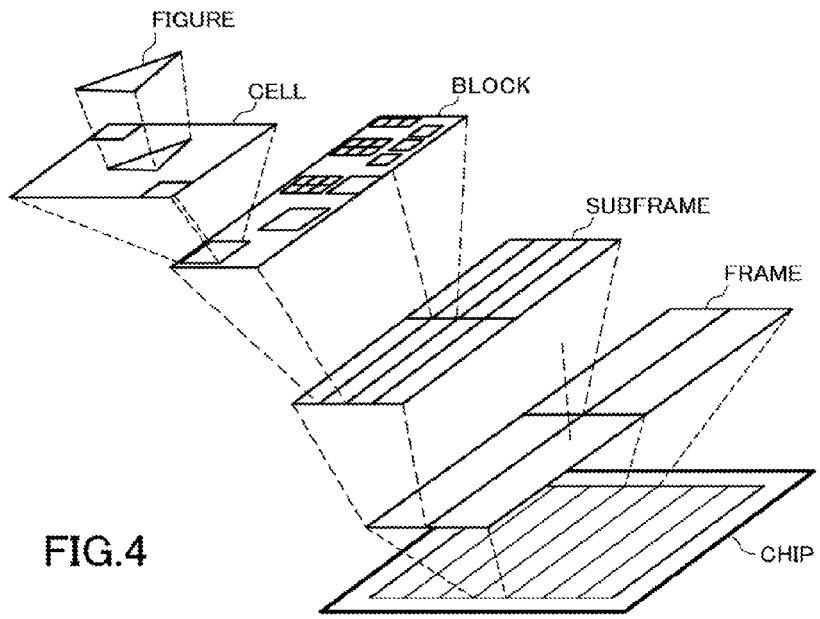
FIG. 4 is a diagram illustrating an example of a hierarchical structure of data.

FIG. 3 is a schematic diagram of the correction/conversion apparatus 200. The correction/conversion apparatus 200 includes a correction processing circuitry 201 that generates the correction map using the design data D1 and the correction condition parameters and converts the design data into drawing data, an assignment processing circuitry 202 that assigns the correction map to each block, and a file generation processing circuitry 204 that describes division maps assigned to respective blocks in files in units of subframe units such that the correction map has a hierarchical structure similar to that of the drawing data thereby generating drawing data D2 with the hierarchical correction map. FIG. 4 is a diagram illustrating an example of a hierarchical structure of data.

In the layout data, a plurality of cells are placed on a chip, and a figure pattern (graphic pattern) is placed in each cell. The correction processing circuitry 201 converts the layout data (the design data) into drawing data defining the shape and the location of the figure pattern. In the drawing data, as illustrated in FIG. 4, a drawing area is described in a hierarchical form in which internal constituent elements are placed in layers such as a chip layer, a frame layer in which a chip area is divided into strips extending in a particular direction (for example, in a y direction) parallel to a drawing plane, a subframe layer in which a frame area is divided into areas with a particular size, a block layer in which a subframe area is divided into areas with a particular size, and a figure layer in which a figure pattern forming the cell is placed.

The correction map includes dose information set for, for example, a cell. The division map includes dose information for one block or a part of a block. The division map is divided into meshes in which dose information (a dose or a dose modulation factor) is defined as a mesh value.

The correction map includes dose information for suppressing a dimensional change caused by a proximity effect which is peculiar to a EUV mask and which has an extremely small influence radius less than 1 μm and more particularly about 300 nm to 400 nm. In view of the above, the mesh size of the mesh of the division map is set to be about 1/10 of the influence radius, and more specifically, for example about 30 nm to 100 nm.

Figure 5:
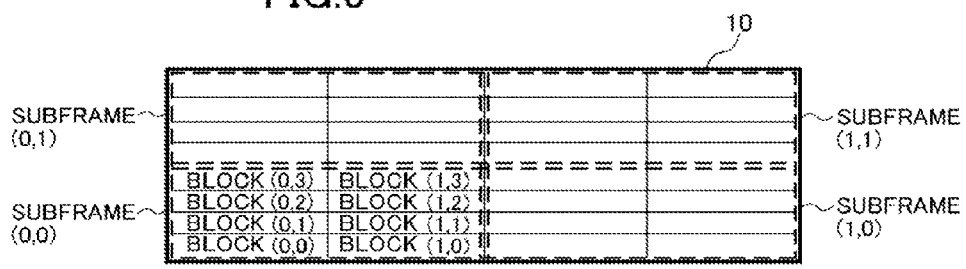
FIG. 5 is a diagram illustrating examples of a subframe and a block.

In the correction map, as illustrated in FIG. 5, a map area 10 is defined by a plurality of subframes each including a plurality of blocks. In the example illustrated in FIG. 5, the map area 10 includes four subframes (0, 0), (0, 1), (1, 0), and (1, 1). Each subframe includes eight blocks (0, 0), (0, 1), (0, 2), (0, 3), (1, 0), (1, 1), (1, 2), and (1, 3).

Figure 6:
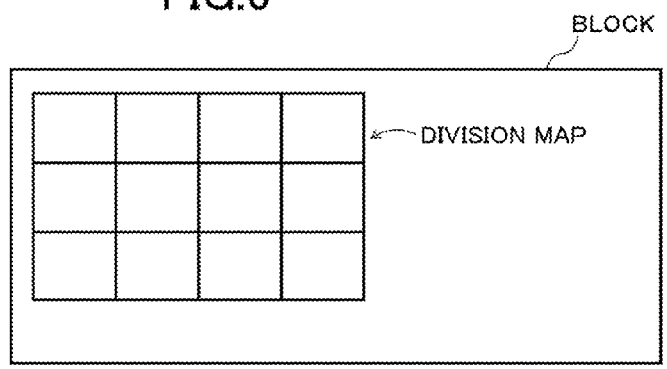
FIG. 6 is a diagram illustrating an example in which one division map is included in one block.

Each block may include a division map. FIG. 6 illustrates an example in which one block includes one division map. FIG. 7 illustrates an example in which one block includes two division maps. Note that there may be a block including no division map.

When one block includes a plurality of division maps, the mesh size may be different among the division maps, as illustrated in FIG. 8.

The assignment processing circuitry 202 divides the correction map into subframe and blocks, and assigns a division map to each block. The file generation processing circuitry 204 describes division maps corresponding to respective blocks in files in units of subframes and generates drawing data D2 with the hierarchical correction map. In the example shown in FIG. 5, four files are generated from the map area 10.

Figure 9:
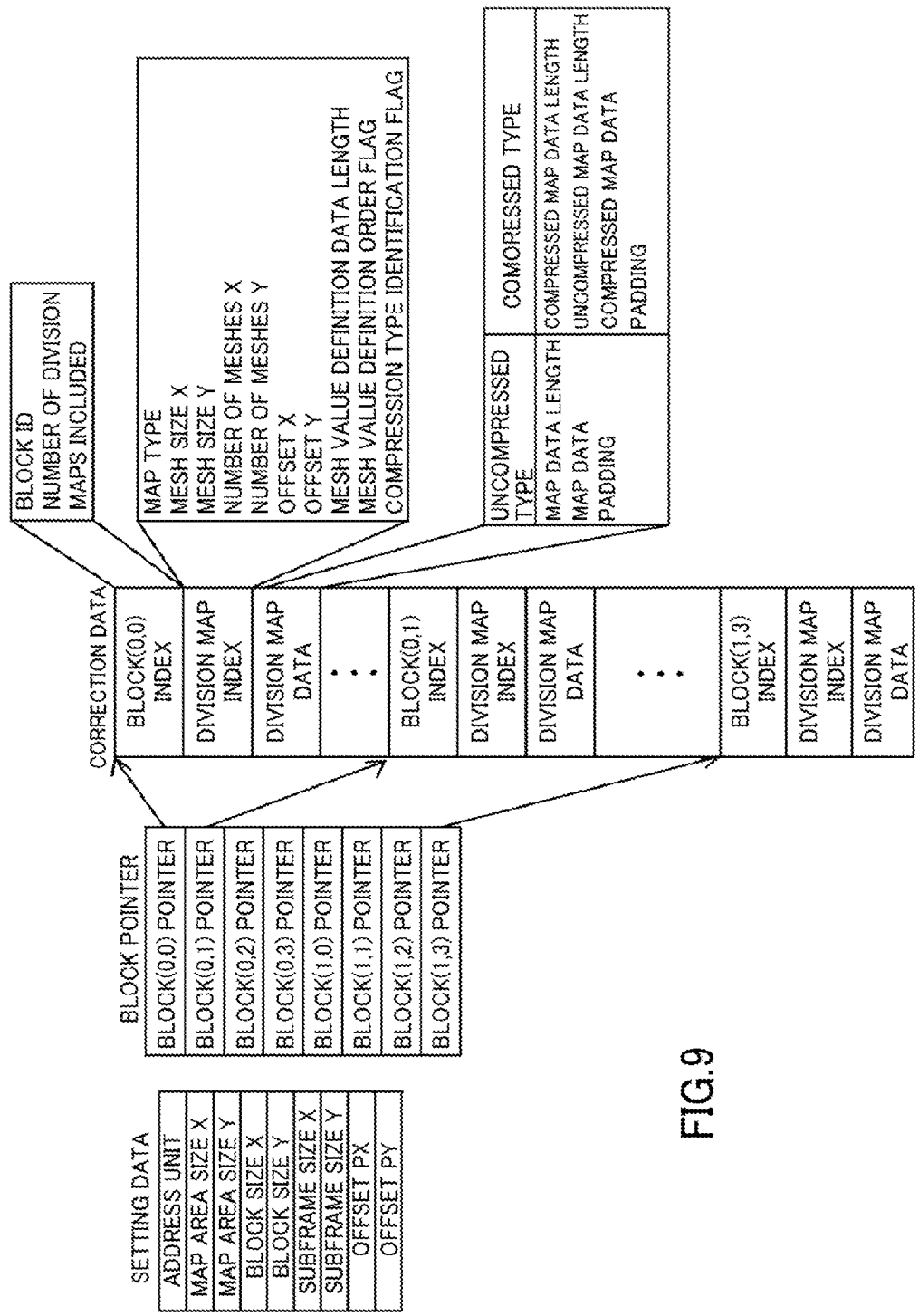
FIG. 9 is a diagram illustrating a data structure of a hierarchical correction map.

FIG. 9 illustrates a data structure of the hierarchical correction map. The hierarchical correction map includes setting data, a block pointer, and correction data. The block pointer and the correction data are described in files in units of subframes. In the setting data, an address unit, a map area size, a block size, a subframe size, and an offset are defined.

Information on a size (a geometric size) and information on coordinates (such as an offset value or the like) included in the hierarchical correction map are defined in units of integral multiples of an address unit defined in the setting data. For example, when the address unit is 1 nm, if a map has an area size of 2 mm in the X direction, then the map area size X in the setting data is defined by a value 2×1000×1000/1=2000000. The map area size X and the map area size Y indicate the size of the map area 10 in the x direction and the y direction, respectively. A block size X and a block size Y indicate a size of one block in the x direction and the y direction, respectively. A subframe size X and a subframe size Y indicate a size of one subframe in the x direction and the y direction, respectively. In the example illustrated in FIG. 5, the subframe size X is 2 times the block size X, and the subframe size Y is 4 times the block size Y.

Figure 10A:
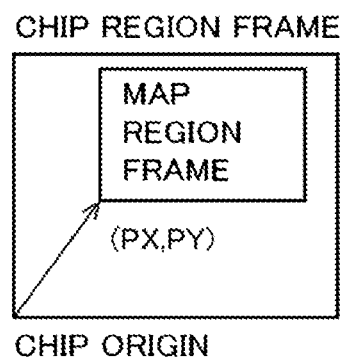
FIGS. 10A and 10B are diagrams illustrating an offset of a map area.
Figure 10B:
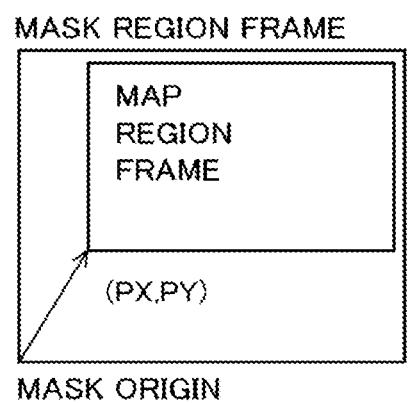

Offsets PX and PY indicate offsets of the map area 10 from an origin in the x direction and the y direction, respectively. As illustrated in FIGS. 10A and 10B, the origin is a chip origin or a mask origin.

The correction data of the hierarchical correction map includes a block index, a division map index and division map data. The block index is defined for each block so as to indicate an ID of the block in a subframe and the number of division maps included. Following the block index, the division map index and the division map data are stored for each division map included in the block.

The division map index includes a map type, a mesh size, the number of meshes, an offset, a mesh value definition data length, a mesh value definition flag, and a compression type identification flag. An example of the map type is dose map. A mesh size X and a mesh size Y indicate the mesh size in a division map in the x direction and the y direction, respectively. By defining the information on the mesh size individually for each block, it becomes possible to place division maps with different mesh sizes in on block as illustrated in FIG. 8.

The number of meshes X and the number of meshes Y indicate the number of meshes in the division map in the x direction and the y direction, respectively. An offset X and an offset Y respectively indicate offsets in the x direction and y direction from a reference point (for example, a vertex at the left bottom corner) of a block. The mesh value definition data length indicates a data length of a mesh value.

Figure 11A:
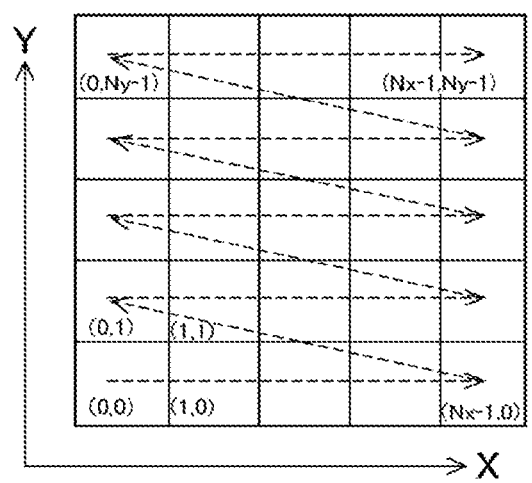
FIGS. 11A and 11B are diagrams illustrating a mesh value definition order.
Figure 11B:
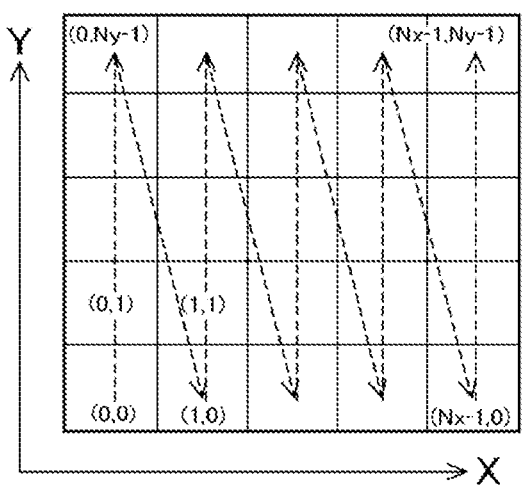

The mesh value definition order flag indicates a definition order of mesh values in the division map. For example, in a case where the mesh value definition flag is equal to 0, this indicates that the mesh values are defined in the x direction as illustrated in FIG. 11A. In a case where the mesh value definition flag is equal to 1, this indicates that the mesh values are defined in the y direction as illustrated in FIG. 11B.

The compression type identification flag indicates whether the division map data following the division map index is in a compressed form or not. For example, in a case where the compression type identification flag is equal to 0, this indicates that the division map data is not compressed. When the compression type identification flag is equal to 1, this indicates that the division map data is compressed. In a case where the data size of the division map data is equal to or greater than a predetermined value, the file generation processing circuitry 204 compresses the division map data and sets the compression type identification flag to 1.

The uncompressed division map data includes a map data length and map data. Compressed division map data includes a compressed map data length, an uncompressed map data length, and compressed map data. The map data includes a mesh value (a dose or a dose modulation factor) of the division map. The division map data is in a padded form.

In the correction data, block indexes, division map indexes, and division map data corresponding to a plurality of blocks included in one subframe are sequentially arranged as illustrated in FIG. 9. For example, in a hierarchical correction map corresponding to a subframe (0, 0) shown in FIG. 5, block indexes, division map indexes of respective division maps included in blocks, and division map data are arranged in the order block (0, 0), block (0, 1), block (0, 2), block (0, 3), block (1, 0) block (1, 1) block (1, 2), and block (1, 3).

The block pointers include block IDs of the respective blocks included in one subframe, and block pointers include information indicating starting locations of corresponding respective correction data. By referring to a block pointer, it is possible to easily access correction data of a desired block.

Figure 12:
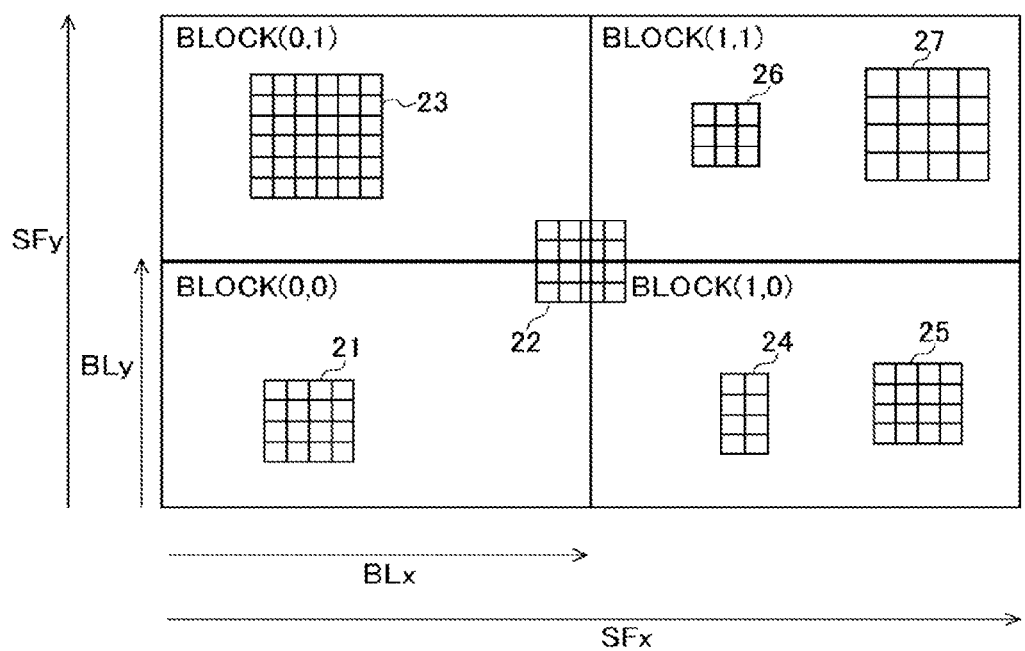
FIG. 12 is a diagram illustrating examples of a subframe and a block.

Referring to specific examples shown in FIG. 12 and FIG. 13, the hierarchical correction map is described in further detail below. FIG. 12 illustrates an example of a subframe. This subframe includes, by way of example, following four blocks: a block (0, 0); a block (0, 1); a block (1, 0); and a block (1, 1).

The block (0, 0) includes division maps 21 and 22. The block (0, 1) includes a division map 23. The block (1, 0) includes division maps 24 and 25. The block (1, 1) includes division maps 26 and 27.

Figure 13:
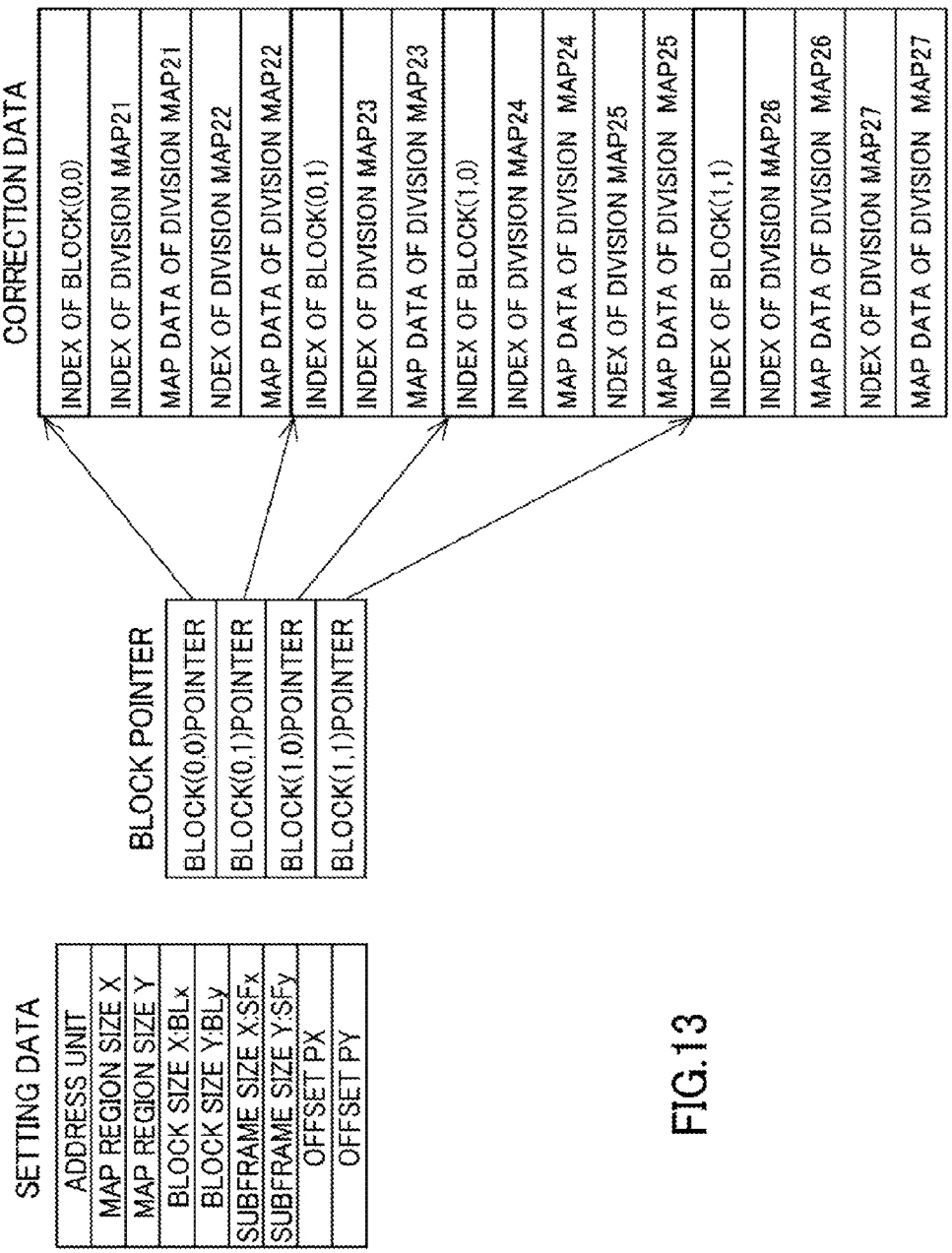
FIG. 13 is a diagram illustrating an example of a hierarchical correction map.

FIG. 13 illustrates a hierarchical correction map associated with the subframe shown in FIG. 12. The block pointers indicate starting locations of correction data of the block (0, 0), the block (0, 1), the block (1, 0), and the block (1, 1), respectively.

Following the block index of the block (0, 0), the division map index of the division map 21, the division map data of the division map 21, the division map index of the division map 22, and the division map data of the division map 22 are stored. Furthermore, the block index of the block (0, 1), the division map index of the division map 23, and the division map data of the division map 23 are stored. Subsequently, the block index of the block (1, 0), the division map index of the division map 24, the division map data of the division map 24, the division map index of the division map 25, and the division map data of the division map 25 are stored. Further subsequently, the block index of the block (1, 1), the division map index of the division map 26, the division map data of the division map 26, the division map index of the division map 27, and the division map data of the division map 27 are stored.

For example, the block index of the block (0, 0) indicates that there are two division maps included therein. The division map index area of the division map 21 includes the mesh size of the division map 21, the number of meshes, the offset from the origin of the block (0, 0), etc. In the division map data area of the division map 21, the mesh value of the division map 21 is stored in the compressed or uncompressed state. The block pointer and the correction data are described in files in units of subframes.

In the present embodiment, the correction map having dose information in the map format is converted such that the correction map is described, in the hierarchical structure, in files in units of subframes, that is, the correction map is represented using a plurality of files. That is, in the drawing data D2 with the hierarchical correction map, the hierarchical correction map has a hierarchical structure similar to that of the drawing data and is described in files for respective areas corresponding to drawing data. Therefore, in a calculation process by the control processing circuitry 220 of the drawing apparatus, the hierarchical correction map can be acquired simply by accessing a file of the hierarchical correction map corresponding to an area to be subjected to the calculation. For example, the control processing circuitry 220 searches for a frame including an area to be subjected to the calculation and then searches for a subframe. Subsequently, the control processing circuitry 220 searches for a block and reads a map attached to this block. Compared with a case in which the whole correction map is described in one file, it is possible to achieve a reduction in the memory size necessary in the calculation process, an increase in the processing speed, and an improvement in data processing efficiency.

Furthermore, because the division map index is provided for each division map thereby defining the mesh size and the like, the mesh size may be different among division maps. This makes it possible to change the mesh size depending on required accuracy, and thus it is allowed to reduce the amount of data of the hierarchical correction map while maintaining the accuracy.

In the embodiment described above, drawing data having a correction map described in one file may be generated using a design tool from the design data D1 and the correction condition parameter, and, from this drawing data with the correction map, the correction/conversion apparatus 200 may generate the drawing data D2 with the hierarchical correction map.

[Second Embodiment]

FIG. 14 is a diagram illustrating a state in which correction maps corresponding to an identical chip are located adjacent to each other. In the correction maps of the chip A shown in FIG. 14, the number of meshes is 6 in the x direction and also 6 in the y direction.

Left and right chips A are different in terms of a surrounding environment on left and right ends, and thus they have different mesh values. More specifically, interference occurs between the right end of the left chip A and the left end of the right chip A, and thus meshes $m_{00}$ to $m_{05}$ of the left chip A have mesh values different from those of meshes $m'_{00}$ to $m'_{05}$ of the right chip A. Similarly, meshes $m_{50}$ to $m_{55}$ of the left chip A have different mesh values from those of meshes $m'_{50}$ to $m'_{55}$ of the right chip A. Therefore, it is not possible to represent two chips A using one correction map. If a correction map associated with a whole chip is provided separately for each of the two chips A, the result is that large amount of data is necessary.

In view of the above, in the present embodiment, the correction map of the chip A is divided into a left end part, a central part, and a right end part as illustrated in FIG. 15. The left end part of the left chip A is denoted as a map 01L, the central part is denoted as a map C, and the right end part is denoted as a map 01R. The left end part of the right chip A is denoted as a map 02L, the central part is denoted as a map C, and the right end part is denoted as a map 02R. The correction values are different between the left and right chips A in terms of the left and right end parts, but the central parts have the same map.

Furthermore, let's consider a case where the chip A includes two blocks $B_{00}$ and $B_{10}$ as illustrated in FIG. 16. In this case, the map C of the central part of the chip A is divided into a map CL and a map CR as illustrated in FIG. 17.

In defining such a correction map, a job deck link code is added to the division map index. Maps and link codes to be defined for blocks $B_{00}$ and $B_{10}$ are defined, for example, as illustrated in FIG. 18A. Furthermore, a job deck such as that shown in FIG. 18B is described in the division map index.

Thus, as shown in FIG. 14, in the case where the identical chip is arranged at a plurality of positions on a mask and the map data is different only in chip boundary areas between adjacent chips due to a difference in a surrounding environment, it is not necessary for the central part to have duplicate map data, and thus it is possible to reduce the data size of the hierarchical correction map.

[Third Embodiment]

In the first embodiment described above, a description is given as to the correction map including dose information for suppressing a pattern size change caused by a phenomenon with a small influence radius. However, the correction map may include correction information in which a phenomenon with a large influence radius is also taken into account.

Let's consider a case in which a chip A and a chip B are adjacent to each other as illustrated in FIG. 19. A correction map of the chip A is denoted by a map MA, and a correction map of the chip B is denoted by a map MB. In the chip A, to neglect an influence of the adjacent chip B, a dose correction for both the phenomenon with the small influence radius and the phenomenon with the large influence radius is performed only in a central part. Similarly, in the chip B, to neglect an influence of the adjacent chip A, a dose correction for both the phenomenon with the small influence radius and the phenomenon with the large influence radius is performed only in a central part.

In the other areas of the chip A and the chip B, a dose correction for the phenomenon with the large influence radius is not performed, but only a dose correction for the phenomenon with the small influence radius is performed. The dose correction for the phenomenon with the large influence radius in these areas is performed internally in the drawing apparatus.

Correction codes are introduced to indicate that the dose correction for the phenomenon with the small influence radius has been performed and indicate that the dose correction for the phenomenon with the large influence radius has been performed. The central part of the chip A is a correction code application area, and the map of this area is denoted as a map CCA. The central part of the chip B is a correction code application area, and the map of this area is denoted as a map CCB. The map CCA and the map CCB are described in the same format as that of the division map.

Figure 21:
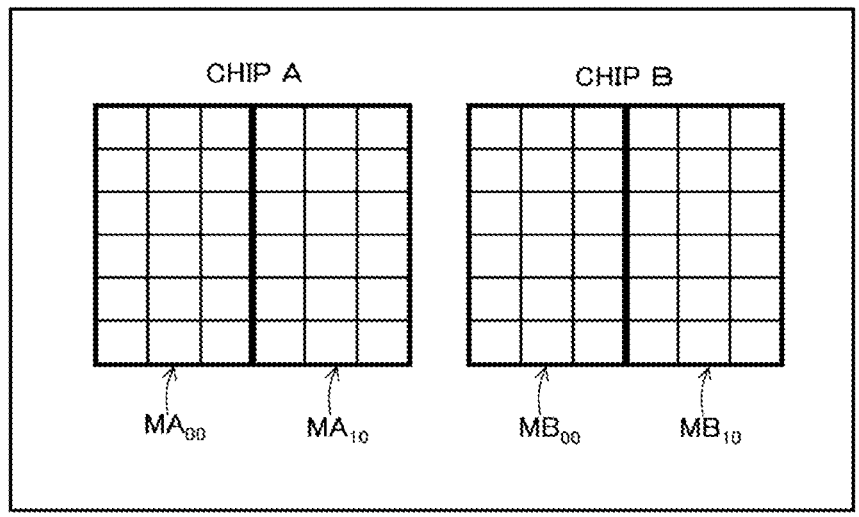
FIG. 21 is a diagram illustrating an example of a manner of dividing correction maps depending on blocks.

Furthermore, let's consider a case in which, as illustrated in FIG. 20, the chip A includes two blocks $BA_{00}$ and $BA_{10}$, and the chip B includes two blocks $BB_{00}$ and $BB_{10}$. In this case, as illustrated in FIG. 21, the map MA is divided into maps $MA_{00}$ and $MA_{10}$, while the map MB is divided into maps $MB_{00}$ and $MB_{10}$. Furthermore, as illustrated in FIG. 22, the map CCA of the correction code application area is divided into maps CCA1 and CCA2, and the map CCB is divided into maps CCB1 and CCB2.

Figure 22:
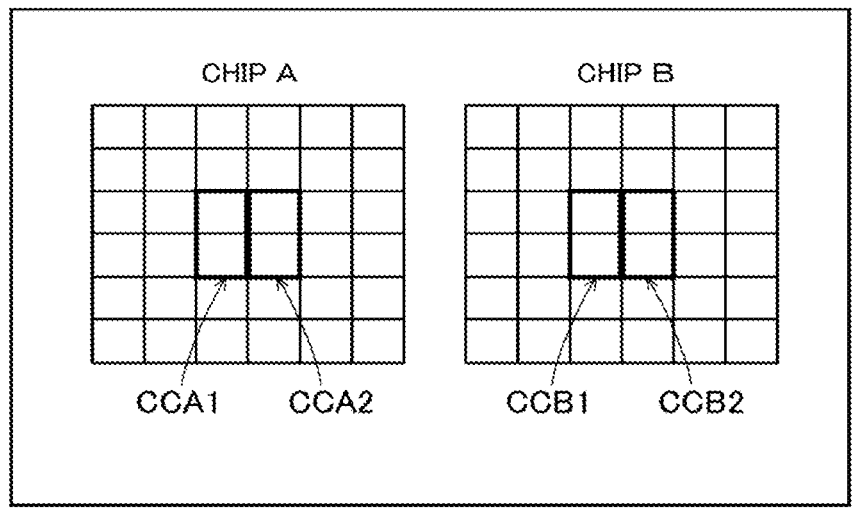
FIG. 22 is a diagram illustrating an example of a manner of dividing correction maps depending on blocks.

By combining FIG. 21 and FIG. 22, the chip A is represented as illustrated in FIG. 23A, and the map is defined as illustrated in FIG. 23B. The chip B is represented as illustrated in FIG. 24A, and the map is defined as illustrated in FIG. 24B. For the maps CCA1, CCA2, CCB1, and CCB2, "correction code application frame" is described in the map type of division map index (see FIG. 9).

By defining the correction code application area in the above-described manner, it becomes possible for the drawing apparatus to discriminate the area for which the dose correction for the phenomenon with the large influence radius is calculated by an external apparatus. For the central part of the chip in which the influence of adjacent chips can be neglected, the dose correction for the phenomenon with the small influence radius and the dose correction for the phenomenon with the large influence radius may be performed in advance by an external apparatus, which allows a reduction in amount of calculation performed internally in the drawing apparatus and thus it is possible to improve the processing efficiency.

[Fourth Embodiment]

As described in the first embodiment, the hierarchical correction map and the drawing data have similar hierarchical structures. Therefore, a pointer to correction map data at the starting point of each block of the drawing data (cell layout information file) may be defined and correction data of a corresponding block in the hierarchical correction map may be linked therefrom.

Figure 25:
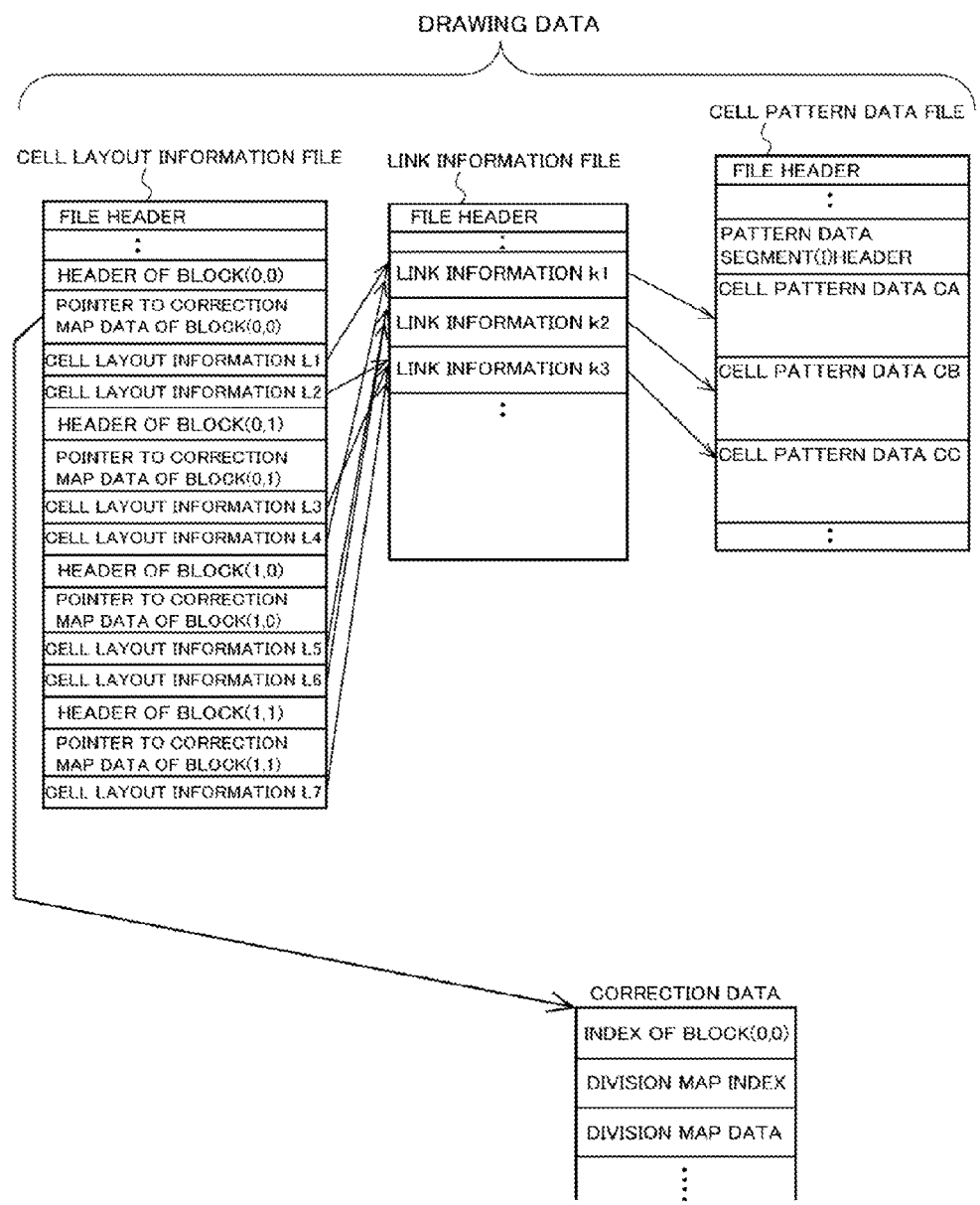
FIG. 25 is a diagram illustrating a data structure of drawing data according to the third embodiment.

FIG. 25 illustrates an example of a data structure of drawing data. The drawing data includes a cell layout information file, a link information file, and a cell pattern data file. In the example of the drawing data shown in FIG. 25, at least one of cells CA, CB, and CC is placed in four blocks (0, 0), (0, 1), (1, 0), and (1, 1).

The cell layout information file includes layout information according to which to place one of a plurality of constituent element patterns, that is, cells CA, CB, and CC in each block area. The cell layout information represented by coordinates or the like indicating a layout location of a reference point of a cell. Herein, following a file header of the cell layout information file, a header of the block (0, 0), a pointer to correction map data of the block (0, 0), cell layout information L1 in the block (0, 0), cell layout information L2, a header of the block (0, 1), a pointer to correction map data of the block (0, 1), cell layout information L3 in the block (0, 1), cell layout information L4, a header of the block (1, 0), a pointer to correction map data of the block (1, 0), cell layout information L5 in the block (1, 0), cell layout information L6, a header of the block (1, 1), a pointer to correction map data of the block (1, 1), and cell layout information L7 in the block (1, 1) are stored.

Each cell layout information Ln includes cell location coordinates and a link information index. Based on these pieces of data in cell layout information file, it is possible to obtain information in terms of coordinates indicating a location of a cell placed in each block, and information for linking to cell pattern information described below.

The cell pattern data file includes pattern information of the cells CA, CB, and CC. In the present example, cell pattern data CA representing pattern data of the cell CA, cell pattern data CB representing pattern data of the cell CB, and cell pattern data CC representing pattern data of the cell CC are each stored sequentially in this order.

The link information file includes link information for linking the cell layout information to the cell pattern information. For example, the cell pattern data CA is referred to from the cell layout information L1 via the link information k1. As described above, by generating cell layout information and cell pattern data in different files, it becomes unnecessary to separately provide pattern data to each layout location, and thus it is possible to reduce the data size of the drawing data.

In the present embodiment, as illustrated in FIG. 25, following a header of each block of a cell layout information file, a pointer to a correction map of a corresponding block is stored. By referring to this pointer, drawing data is directly linked to a corresponding block of a hierarchical correction map. This makes it possible to easily access drawing data and data of a corresponding block in the hierarchical correction map in the calculation process in the drawing apparatus, and thus it is possible to further improve the data processing efficiency.

The drawing data shown in FIG. 25 is generated from the design data by a not-shown drawing data generation apparatus. According to the design data, the drawing data generation apparatus divides the drawing area into a plurality of blocks and generates a cell layout information file for each divided block such that the file includes layout information for placing one of the cells, and a pointer pointing to a storage location of the division map index of the corresponding block in the hierarchical correction map.

The drawing data generation apparatus generates a cell pattern data file including cell pattern data according to the design data. Furthermore, based on the design data, the drawing data generation apparatus generates a link information file including link information that links cell layout information to cell pattern data. The drawing data generation apparatus then generates drawing data including the cell layout information file, the cell pattern data file, and the link information file, and outputs the resultant drawing data.

In the embodiments described above, it is assumed by way of example but not limitation that the electron beam is used as the charged particle beam. However, alternatively, other types of charged particle beams such as an ion beam may be used.

At least part of the correction/conversion apparatus 200 described in the above embodiments may be implemented in either hardware such as electrical circuits or software. When implemented in software, a program that realizes at least part of functions of the correction/conversion apparatus 200 may be stored on a recording medium such as a flexible disk or CD-ROM and read and executed by a computer including electrical circuits. The recording medium is not limited to a removable recording medium such as a magnetic disk or optical disk, but may be a non-removable recording medium such as a hard disk device or memory.

The program that realizes at least part of the functions of the correction/conversion apparatus 200 may be distributed through a communication line (including wireless communications) such as the Internet. Further, the program may be encrypted, modulated, or compressed to be distributed through a wired line or wireless line such as the Internet or to be distributed by storing the program on a recording medium.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A charged particle beam drawing apparatus comprising:
  a drawing unit that draws a pattern in a drawing area on a substrate by using a charged particle beam; and
  a control processing circuitry that controls the drawing unit via a process including
    receiving drawing data with a hierarchical correction map input to the control processing circuitry, the drawing data with the hierarchical correction map including a plurality of files in which division maps are respectively described in files in units of subframes, each division map including dose correction information associated with a corresponding at least one block in the drawing area, generating shot data by performing a data conversion process on the drawing data, reading a division map corresponding to the at least one block in the drawing area from the hierarchical correction map, calculating a dose based on the dose correction information in the division map read from the hierarchical correction map, and controlling the drawing unit based on the shot data and the calculated dose.

2. The apparatus according to claim 1, wherein in the hierarchical correction map, division map indexes and division map data are defined for respective division maps and described in files in units of subframes, each division map index including information indicating a mesh size and the number of meshes of a division map included in each block, the division map data including dose correction information associated with each mesh, and each file includes a block pointer indicating a storage location of a division map index of each block in the file.

3. The apparatus according to claim 2, wherein the division map index includes a definition order flag indicating a definition order of the dose correction information of each mesh, and the control processing circuitry acquires the dose correction information from the division map data based on the definition order flag.

4. The apparatus according to claim 2, wherein the division map index includes a compression type identification flag indicating whether the division map data is compressed or not.

5. The apparatus according to claim 2, wherein the division map index includes a link code for linking to division map data, and wherein link codes included in division map indexes of division maps in different blocks link to identical division map data.

6. The apparatus according to claim 2, wherein the dose correction information is subjected in advance to a first correction in terms of a dose taking into account a phenomenon with a small influence radius or a second correction in terms of a dose taking into account both a phenomenon with a large influence radius and the phenomenon with the small influence radius, the division map index includes a correction code indicating which one of the first correction and second correction has been performed on the dose correction information of division map data, and the control processing circuitry calculates the dose based on the correction code.

7. The apparatus according to claim 1, wherein the drawing data includes cell layout information provided for each block, the cell layout information indicating a layout location of a reference point of a cell, and the drawing data further includes a pointer indicating a storage location of the division map corresponding to each block.

8. A method of generating drawing data for a charged particle beam drawing apparatus, comprising:

inputting design data and correction condition parameters, the design data defining a plurality of cells in a chip area, each cell including at least one figure pattern;

converting the design data into drawing data in which a shape and a location of each figure pattern are defined;

determining dose correction information for correcting a proximity effect using the design data and the correction condition parameters;

dividing a drawing area into a plurality of subframes;

dividing each subframe into a plurality of blocks;

assigning a division map including the dose correction information to each block;

describing, in files in units of subframes, the mesh size and the number of meshes of a division map included in each block, and the dose correction information associated with each mesh; and outputting the drawing data with a hierarchical correction map including a hierarchical correction map and the drawing data, the hierarchical correction map including a plurality of files corresponding to a plurality of subframes.

9. The method according to claim 8, wherein in the describing in the files, a division map index and division map data are defined for each division map and described in a corresponding file together with a block pointer, the division map index including information in terms of a mesh size and the number of meshes of a division map included in each block, the division map data including the dose correction information associated with each mesh, and the block pointer indicating a storage location of the division map index of each block.

10. The method according to claim 9, wherein the division map index includes a definition order flag indicating a definition order of each mesh in the division map.

11. The method according to claim 9, wherein in a case where the division map data has a data size equal to or greater than a predetermined value, the division map data is compressed, and a compression type identification flag indicating that the division map data is compressed is set in the division map index.

12. The method according to claim 9, wherein the division map index includes a link code for linking to division map data, and wherein link codes included in division map indexes of division maps in different blocks link to identical division map data.

13. A method of generating drawing data input to a charged particle beam drawing apparatus, the drawing data including dose correction information for correcting a proximity effect, the method comprising:

inputting drawing data with a correction map, the correction map including the dose correction information associated with a corresponding drawing area;

dividing the drawing area into a plurality of subframes;

dividing each subframe into a plurality of blocks;

assigning division maps obtained by dividing the correction map to the respective blocks, describing the mesh size, the number of meshes, and the dose correction information associated with each mesh in files in units of subframes; and outputting drawing data having the hierarchical correction map, the hierarchical correction map including a plurality of files corresponding to a plurality of subframes.

14. The method according to claim 13, further comprising:

inputting design data and correction condition parameters, the design data defining a plurality of cells in a chip area, each cell including at least one figure pattern;

converting the design data into drawing data in which a shape and a location of each figure pattern are defined;

determining the dose correction information for correcting a proximity effect using the design data and the correction condition parameters, and generating the drawing data with the correction map using a correction map including the dose correction information corresponding to a drawing area and using the drawing data.

15. The method according to claim 13, wherein in the describing in the files, division map indexes and division map data are defined for respective division maps and described together with a block pointer in units of subframes, each division map index including information indicating a mesh size and the number of meshes of a division map included in each block, the division map data including the dose correction information associated with each mesh, and the block pointer indicating a storage location of the division map index of each block.

16. The method according to claim 15, wherein the division map index includes a definition order flag indicating a definition order of each mesh in the division map.

17. The method according to claim 15, wherein
in a case where the division map data has a data size equal to or greater than a predetermined value, the division map data is compressed,
and a compression type identification flag indicating that the division map data is compressed is set in the division map index.

18. The method according to claim 15, wherein
the division map index includes a link code for linking to division map data;
wherein link codes included in division map indexes of division maps in different blocks link to identical division map data.

* * * * *